(12) United States Patent
Shah

(10) Patent No.: US 7,056,978 B2
(45) Date of Patent: *Jun. 6, 2006

(54) TOUGHENED EPOXY-ANHYDRIDE NO-FLOW UNDERFILL ENCAPSULANT

(75) Inventor: Jayesh P. Shah, Plaistow, NH (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 205 days.

This patent is subject to a terminal disclaimer.

(21) Appl. No.: 10/289,504

(22) Filed: Nov. 6, 2002

(65) Prior Publication Data

US 2004/0087681 A1    May 6, 2004

(51) Int. Cl.
  *C08L 63/00* (2006.01)

(52) U.S. Cl. .................. 525/65; 523/400; 523/427; 528/87; 528/89; 528/93; 528/94; 528/103; 528/112; 528/297; 528/403; 528/405; 528/419; 528/421

(58) Field of Classification Search ................ 523/201; 528/112, 113, 115, 93, 103, 104, 403, 408; 525/390, 523, 533, 902

See application file for complete search history.

(56) References Cited

U.S. PATENT DOCUMENTS

| 5,789,482 | A  | * | 8/1998  | Eldin et al. .................. 525/65 |
| 6,111,015 | A  | * | 8/2000  | Eldin et al. .................. 525/65 |
| 6,180,696 | B1 |   | 1/2001  | Wong et al. |
| 6,624,216 | B1 | * | 9/2003  | Morganelli et al. ......... 523/435 |
| 6,638,567 | B1 | * | 10/2003 | Beisele ....................... 427/116 |
| 2003/0149135 | A1 | | 8/2003 | Morganelli et al. |

FOREIGN PATENT DOCUMENTS

| CA | 2164915 | * | 6/1996 |
| EP | 0449776 |   | 10/1991 |
| EP | 0578613 |   | 1/1994 |

OTHER PUBLICATIONS

Moon, Kyoung-Sik, et al.: "Study on the Effect of Toughening of No-Flow Underfill on Fillet Cracking"; 2001 Elec. Components and Tech. Conf.; 2001 IEEE.

Weaver, J. et al.: "Improving The Reliability And Performance Of Microelectronic Packaging"; ANTEC 2001; pp. 1340-1343.

* cited by examiner

*Primary Examiner*—Marc S Zimmer
(74) *Attorney, Agent, or Firm*—Charles W. Almer

(57) ABSTRACT

A curable underfill encapsulant composition which is especially useful in the no-flow underfill encapsulation process. The composition contains an epoxy resin, a fluxing agent, a linear polyanhydride, a core shell polymer and a catalyst. In an alternative embodiment, the composition also contains a linear anhydride. Various additives, such as surfactants and coupling agents may also be added to the composition.

24 Claims, No Drawings

TOUGHENED EPOXY-ANHYDRIDE NO-FLOW UNDERFILL ENCAPSULANT

FIELD OF THE INVENTION

The invention relates to an underfill encapsulant which may be utilized in no-flow underfilling processes.

BACKGROUND OF THE INVENTION

This invention relates to underfill encapsulant compounds prepared from epoxies to protect and reinforce the interconnections between an electronic component and a substrate in a microelectronic device. Microelectronic devices contain multiple types of electrical circuit components, mainly transistors assembled together in integrated circuit (IC) chips, but also resistors, capacitors, and other components. These electronic components are interconnected to form the circuits, and eventually are connected to and supported on a carrier or a substrate, such as a printed wire board. The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board.

Whether the component is a bare chip connected to a lead frame, or a package connected to a printed wire board or other substrate, the connections are made between electrical terminations on the electronic component and corresponding electrical terminations on the substrate. One method for making these connections uses polymeric or metallic material that is applied in bumps to the component or substrate terminals. The terminals are aligned and contacted together and the resulting assembly is heated to reflow the metallic or polymeric material and solidify the connection.

During its normal service life, the electronic assembly is subjected to cycles of widely varying temperature ranges. Due to the differences in the coefficient of thermal expansion for the electronic component, the interconnect material, and the substrate, this thermal cycling can stress the components of the assembly and cause it to fail. To prevent the failure, the gap between the component and the substrate is filled with a polymeric encapsulant, hereinafter called underfill or underfill encapsulant, to reinforce the interconnect material and to absorb some of the stress of the thermal cycling. In addition, the material helps to absorb impact energy and improve so-called "drop test" performance.

Two prominent uses for underfill technology are for reinforcing packages known in the industry as chip scale packages (CSP), in which a chip package is attached to a printed wire board, flip-chip ball grid array (BGA) in which a chip is attached by a ball and grid array to a printed wire board, and flip chip devices.

In conventional capillary flow underfill applications, the underfill dispensing and curing takes place after the reflow of the metallic or polymeric interconnect. In this procedure, flux is initially placed on the metal pads on the substrate. Next, the chip is placed on the fluxed area of the substrate, on top of the soldering site, for the case of a metallic connection. The assembly is then heated to allow for reflow of the solder joint. At this point, a measured amount of underfill encapsulant material is dispensed along one or more peripheral sides of the electronic assembly and capillary action within the component-to-substrate gap draws the material inward. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

The no-flow underfill process provides a more efficient procedure than that described above for attaching electronic components to a substrate and protecting the assembly with an underfill encapsulant. In the no-flow encapsulation process the flux is contained in the underfill which is applied to the assembly site prior to the component placement. After the component is placed, it is soldered to the metal pad connections on the substrate by passing the full assembly, comprising the component, underfill and substrate, through a reflow oven. During this process the underfill fluxes the solder and metal pads, the solder joint reflows to form the interconnect joint between the component and the substrate, and the underfill cures. Attempts to use fillers in no flow underflow compositions have generally failed because the particles can get between the pad and the solder and interfere with the solder joint formation. Thus, the separate steps of applying the flux and post-curing the underfill are eliminated via this process. As soldering and cure of the underfill occur during the same step of the process, maintaining the proper viscosity and cure rate of the underfill material is critical in the no-flow underfill encapsulation process. The underfill must remain at a low viscosity (in the range of about 3,000–6,000 cps) for ease of dispensing and to allow melting of the solder and the formation of the interconnections between the component and the substrate. It is also important that the cure of the underfill not be unduly delayed after the cure of the solder. It is desirable that the underfill in the no-flow process cure rapidly in one reflow pass after the melting of the solder. Further, the underfill must provide excellent adhesion to the solder mask, solder, and the passivation layer of the die. Overall, the underfill must also exhibit a long work life at room temperature and have good reliability during thermal cycling. No flow underfill materials, however, are relatively rigid and brittle in nature and eventually crack and delaminate during thermal cycling between −55° C. and 125° C.

SUMMARY OF THE INVENTION

The invention relates to a curable underfill encapsulant composition which is especially useful in the no-flow underfill encapsulation process. The composition contains an epoxy resin, a fluxing agent, a linear polyanhydride, a core shell polymer toughener and a catalyst. In an alternative embodiment, the composition also contains a cyclic anhydride. Various additives, such as surfactants and coupling agents may also be added to the composition.

DETAILED DESCRIPTION OF THE INVENTION

The resins used in the underfill encapsulation composition of the present invention are curable compounds, which means that they are capable of polymerization. As used in this specification, to cure will mean to polymerize, with cross-linking. Cross-linking, as understood in the art, is the attachment of two polymer chains by bridges of an element, a molecular group, or a compound, and in general takes place upon heating.

Ingredients of the present invention include one or more epoxy resins, fluxing agents, linear polyanhydrides, core shell polymer tougheners and catalysts. Optionally, cyclic anhydrides, surfactants, reactive diluents and other ingredients may also be included. The ingredients are specifically chosen to obtain the desired balance of properties for the use of the particular resin.

Examples of epoxy resins suitable for use in the present underfill composition include monofunctional and multi-functional glycidyl ethers of Bisphenol-A and Bisphenol-F, and cycloaliphatic epoxy resins or a combination thereof. The cycloaliphatic epoxides are preferably selected from non-glycidyl ether epoxides containing more than one 1.2 epoxy group per molecule. These epoxides are characterized by a ring structure wherein the epoxide group may be part of the ring or may be attached to the ring structure. Examples of non-glycidyl ether epoxides include 3,4-epoxycyclohexylmethyl-3,4-epoxycyclohexane carboxylate, which contains two epoxide groups that are part of the ring structures and an ester linkage, vinylcyclohexene dioxide, which contains two epoxide groups and one of which is part of the ring structure, 3,4-epoxy-6-methyl cyclohexyl methyl-3,4-epoxycyclohexane carboxylate and dicyclopentadiene dioxide.

Glycidyl ether epoxides are preferred in the invention, either separately or in combination with the non-glycidyl ether epoxides. These resins are selected from glycidyl ether epoxides containing more than one 1.2 epoxy group per molecule. A preferred epoxy resin of this type is bisphenol A resin. Preferred bisphenol A type resin includes 2,2-bis (4-hydroxyphenyl) propane-epichlohydrin copolymer. A most preferred epoxy resin is bisphenol F type resin. These resins are generally prepared by the reaction of one mole of bisphenol F resin and two moles of epichlorohydrin. A further preferred type of epoxy resin is epoxy novolac resin. Epoxy novolac resin is commonly prepared by the reaction of phenolic resin and epichlorohydrin. A preferred epoxy novolac resin is poly(phenyl glycidyl ether)-co-formaldehyde. Biphenyl type epoxy resin may also be utilized in the present invention. This type of resin is commonly prepared by the reaction of biphenyl resin and epichlorohydrin. Dicyclopentadiene-phenol epoxy resin, naphthalene resins, epoxy functional butadiene acrylonitrile copolymers, epoxy functional polydimethyl siloxane and mixtures thereof are additional types of epoxy resins which may be employed. The preferred epoxy for the underfill encapsulant of the present invention is bisphenol F type. A commercially available bisphenol-F type resin is available from CVC Specialty Chemicals, Maple Shade, N.J., under the designation 8230E. Bisphenol-A type resin is commercially available from Resolution Technology as EPON 828, and a blend of bisphenol-A and bisphenol-F is available from Nippon Chemical Company under the designation ZX-1059.

The linear polyanhydride of the invention must be chosen so that the no-flow underfill encapsulant maintains a low viscosity below the melting point of the solder and also just above the melting point of the solder long enough to allow the solder and metal pads to interconnect. The linear polyanhydride used in the underfill encapsulant is multifunctional. The initial reaction with the resin is to cleave the polymeric anhydride chain, thereby decreasing molecular weight. This is shown schematically in the diagram below:

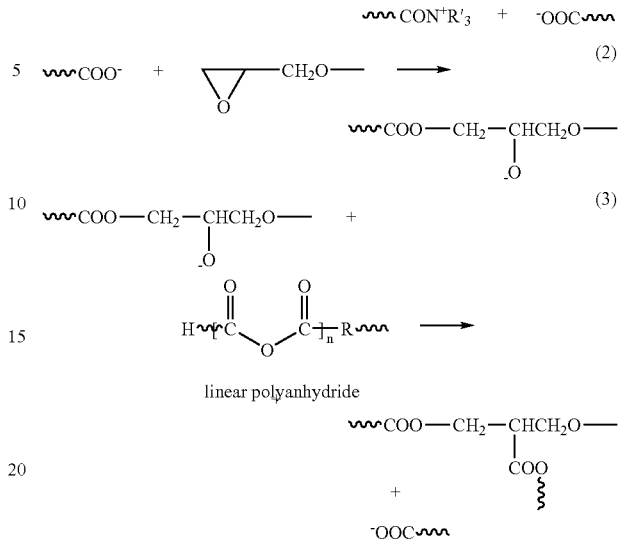

linear polyanhydride

In step (1), the linear polyanhydride chain is cleaved by the catalyst. In this scheme, R is a 4–10 carbon linear polymethylene segment. In step (2), the usual carboxylate-epoxy reaction is initiated. In step (3) the alkoxide ion of the epoxy again reacts to cleave another polyanhydride chain. The cleaving process, by reducing the molecular weight of the polyanhydride, in effect delays the increase in viscosity. Thus, with no delay in the curing process, the composition of the invention remains at low viscosity for an extended period of time. The molecular weight inevitably begins to rise at higher extents of cure. In addition, the linear polyanhydride functions as a fluxing agent. The preferred linear polyanhydride is polysebacic polyanhydride (PSPA) which is formed from the dehydration of sebacic acid. The preferred PSPA is available as PSPA from Lonza, Inc., Intermediates and Additives, Pasadena, Tex. Other linear polyanhydrides which may be utilized include polyazelaic polyanhydride and polyadipic polyanhydride. A formulation having a linear polyanhydride provides rapid reactivity without a rapid rise in viscosity. A further advantage of the linear polyanhydride is that it is a low vapor pressure solid. Consequently, at elevated temperatures above the crystalline melting point there is little tendency for the polyanhydride to volatilize and create voids in the curing underfill.

A catalyst is preferably utilized in the underfill encapsulant. A preferred catalyst is 1-cyanoethyl-2-ethyl-4-methylimidazole. This material is a liquid imidazole, preferably blocked or protected for delayed reactivity, and is commercially available under the trade name CURIMID-DN, from Poly Organix, Inc., Newburyport, Mass. Other useful catalysts include AMICURE 2PIP (Air Products & Chemicals, Allentown, Pa.), alkyl-substituted imidazole, triphenylphosphine, imidazolium salts, imidazole phosphate, imidazole salts, onium borate, metal chelates, and mixtures thereof.

In underfill formulations containing a linear polyanhydride, the linear polyanhydride imparts a great deal of flexibility to the cured composition. Such flexibility is desirable in certain uses, such as assembly of CSP's. A more rigid cured composition is desirable in certain other uses, such as those uses requiring increased durability in thermal shock reliability tests. In these cases requiring a more rigid composition, it is desirable to incorporate a second anhydride or higher functionality epoxy into the formula to provide higher rigidity and higher glass transition temperature. The preferred second anhydride is preferably a cycloaliphatic anhydride and most preferably methylhexahydro phthalic anhydride (MHHPA), which is commercially available as MHHPA from Lonza. Other cyclic anhydrides which may be utilized, especially to increase the glass transition temperature, include methyltetra-hydrophthalic anhydride, nadic methyl anhydride, hexa-hydro phthalic anhydride, tetra-hydro phthalic anhydride, phthalic anhydride, dodecyl succinic anhydride, or mixtures thereof. In the underfill encapsulant formulation containing both a linear polyanhydride and a cyclic anhydride, the ratio of the two components is preferably stoichiometric. Further, the preferred formulation should be substantially free of reacting species that would vitiate the effects of the linear polyanhydride by increasing viscosity too early and by accelerating the cross-linking process.

A core-shell polymer toughener is included in the underfill in order to improve the adhesion of the underfill to the solder and silicon die, improve crack resistance and increase the fracture toughness of the underfill without damaging the temperature resistance of the underfill. The crack resistance of the underfill is an important criteria because it is the most common cause of failure during thermal cycling. Consequently, the thermal cycling properties of the underfill are also improved. The core-shell polymer toughener is an organic filler that is preferably well-dispersed within the underfill and has a sub-micron particle size within the range of about 0.1–0.5 µm. The sub-micron particle size prevents interference with the solder joint formation during the reflow process and does not diminish the yield. Further, the addition of the toughener has been shown to have virtually no effect upon the Tg of the underfill. The toughener greatly increases the reliability of the solder joints during a −55° C. to 125° C. liquid to liquid thermal cycle, as shown in Table 1. The increase in the reliability may be attributed to the increased adhesion to the solder and substrate and the increased fracture toughness, as shown in Table 2. One further benefit is that the organic fillers utilized as a toughener lower the enthalpy of the no-flow underfill, which provides certain advantages in meeting less restrictive shipping regulations and classifications. Exemplary core-shell polymer tougheners include acrylonitrile-butadiene-styrene core shell polymer, sold under the tradename BLENDEX-415 (General Electric Company) and methacrylate butadiene styrene core shell polymer, sold under the trade name BTA-753 (Rohm & Haas Company). Other core-shell polymer modifiers include acrylic impact modifiers.

Additional ingredients may be added to the underfill encapsulant to produce a composition with the desired properties. For example, monofunctional reactive diluents can incrementally delay the increase in viscosity without adversely affecting the physical properties of the cured underfill. A preferred diluent is p-tert-butyl-phenyl glycidyl ether, although other diluents such as allyl glycidyl ether, glycerol diglycidyl ether, glycidyl ether or alkyl, butanediodiglydidylether and mixtures thereof may be utilized. Surfactants may be utilized to aid in the prevention of process voiding during the flip-chip bonding process and subsequent solder joint reflow and material curing. Various surfactants which may be utilized include organic acrylic polymers, silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers and mixtures thereof. In addition, coupling agents, polymeric modifiers and other ingredients may also be added as desired.

An alternative embodiment of the formulation of the underfill encapsulant of the present invention comprises an epoxy resin, a linear polyanhydride that functions as a fluxing agent, a catalyst, a core-shell polymer, and other ingredients as desired, such as a surfactant. The epoxy resin may comprise in the range of about 25 to about 95 wt % epoxy resin. Preferably, the underfill will comprise in the range of about 35 to about 65 wt % of the epoxy resin. The formulation also comprises in the range of about 2 wt % to about 50 wt % of the linear polyanhydride which contains a fluxing agent. More preferably the underfill will comprise in the range of about 5 wt % to about 35 wt % of the linear polyanhydride curing agent. The linear polyanhydride is preferably in particles that are smaller than 50 microns. The core-shell polymer comprises about 1 to about 15 wt % of the formulation. Most preferably, the core-shell polymer will comprise in the range of about 2 wt % to about 8 wt % of the underfill. Finally, additional ingredients may also be added as desired. In a preferred formulation, in the range of about 0.05 wt % to about 1.0 wt %, and more preferably about 0.1 wt % to about 0.25 wt % of a catalyst is added and in the range of about 0 wt % to about 0.75 wt %, and more preferably about 0.2 wt % to about 0.6 wt % of a surfactant is also added.

In a preferred embodiment, the underfill encapsulant comprises an epoxy resin, a linear polyanhydride, a cyclic anhydride, a core shell polymer, a catalyst, and additional ingredients as desired, such as a surfactant. The underfill may comprise in the range of about 25 to about 75 wt % epoxy resin. Preferably, the underfill will comprise in the range of about 35 wt % to about 65 wt % of the epoxy resin. The formulation also comprises in the range of about 2 wt % to about 40 wt % of the linear polyanhydride. More preferably the underfill will comprise in the range of about 5 to about 30 wt % of the linear polyanhydride. The linear polyanhydride is preferably in particles that are smaller than 50 microns. The underfill will comprise in the range of about 0 wt % to about 45 wt % of the cyclic anhydride. Preferably, the underfill will comprise in the range of about 0 wt % to about 30 wt % of the cyclic anhydride. The core-shell polymer comprises about 1 wt % to about 15 wt % of the formulation. Most preferably, the underfill will comprise in the range of about 2 wt % to about 8 wt % of the core-shell polymer. Finally, additional ingredients may also be added as desired. In a preferred formulation, in the range of about 0.05 wt % to about 1.0 wt %, and more preferably about 0.1 wt % to about 0.25 wt % of a catalyst is added and in the range of about 0 wt % to about 0.75 wt %, and more preferably about 0.2 wt % to about 0.6 wt % of a surfactant is also added.

The invention may be better understood by reference to the following example.

EXAMPLE 1

Three different underfill encapsulants were formed as follows. The epoxy resin was weighed in the mixing container. Core shell polymer was added to the resin and mixed for five minutes at a slow speed until it was incorporated within the resin. The composition was then mixed at a high speed for 1–2 hours until the composition was finely dispersed. The composition was checked on the Hegman grind gauge to ensure that there were no undispersed particles of core shell polymer. Additional epoxy resin was weighed and added to the composition. Additives, such as the air release agent and adhesion promoter were added and the composition was mixed slowly with a dispersion blade for two minutes until the composition was homogeneous. The polysebacic polyanhydride was added while mixing the composition at a slow speed, and mixing was continued until the composition was homogeneous. The MHHPA was then added and the composition was mixed for ten minutes until it was homogeneous. The mixer was stopped and the composition was scraped off of the sidewalls of the mixing container. Finally, the catalyst was added to the composition and it was mixed for an additional five minutes. These encapsulants are shown in Table 1.

TABLE 1

Underfill Encapsulants Having Core Shell Polymer

| Material | Control | A | B |
|---|---|---|---|
| Bisphenol F Epoxy Resin[1] | 54.8 | | |
| Bisphenol A/ Bisphenol F Epoxy Blend[2] | | 48.444 | 48.163 |
| Core Shell Polymer | | 7.5[3] | 4.288[4] |
| Polysebacic Polyanhydride | 22.15 | 20.579 | 22.211 |
| MHHPA | 22.15 | 20.579 | 20.211 |
| Silicon Air Release Agent[5] | 0.4 | 0.251 | 0.251 |
| Glycidoxypropyl Tri-Methoxy Silane[6] | 0.4 | 0.251 | 0.251 |
| Catalyst[7] | 0.22 | 0.125 | 0.125 |

[1] EPPALOY 8230E (CVC Specialty Chemicals, Inc.)
[2] ZX1059 (Nippon Chemical Company)
[3] 50% BLENDEX-415 (ABS - used as predispersed in 1059 ZX resin at 14 wt %) and 50% Silicone (Hanse Chemie - used as received as 40% by wt dispersion in Bisphenol A resin)
[4] BTA-753 (Rohm & Haas - used as predispersed in ZX1059 resin at 8.16 wt. %)
[5] BYK A-500 (Byk Chemie)
[6] Silane A-187 (Dow Corning)
[7] Control - Imidazole phosphate, AMICURE 2PIP (Air Products) Formulations A, B - CURIMID-CN (Shikoku, Air Products)

The control formulation and formulations A and B were tested for their performance properties and the results are illustrated in Table 2.

TABLE 2

Performance Properties of Underfill Encapsulants

| Performance Properties | Control | A | B |
|---|---|---|---|
| Viscosity @ 250° C. (cps) | 3,300 | 2,850 | 3,400 |
| Yield - uBGA | 100% | 100% | 100% |
| Yield - PB-8 | 100% | 100% | 100% |
| Enthalpy (J/g) | 330 | 269 | 329 |
| Adhesion to Silicon Chip (Stud Pull Strength) (lbs.) | 42.5 | 71 | 69 |
| Tg (DSC) (° C.) | 62.2 | 61.3 | 62 |
| Fracture Toughness K1C Mpa * m1/2 | 1.88 | 2.6 | 2.56 |
| Energy Release Rate J/m2 | 1,255 | 2,800 | 2,753 |
| Reliability: (−55° C. to 125° C.) cycles-OSP-Cu | 658 | 1136 | 1109 |
| Reliability: (−55° C. to 125° C.) cycles-Ni-Au | 230 | 380 | 404 |

Table 2 clearly illustrates that the underfills containing the core shell polymer have greater adhesion to silicon chips, fracture toughness, energy release rate and reliability than the underfill without the core shell polymer.

As shown in Tables 3 and 4, the continuity of the underfill containing the core shell polymer was equal or superior to that of the underfill without the core shell polymer at many different test cycles on both Ni—Au and OSP substrates. For evaluation purposes, failure was designated as an increase in resistivity of 20% or greater for two consecutive testing intervals, as determined by the average resistivity for the entire population of samples tested.

TABLE 3

Underfill Reliability on Ni—Au Substrate

| Underfill | Initial Elec. Continuity (ohms) | Continuity After 106 cycles | Continuity After 230 Cycles | Continuity After 379 Cycles | Continuity After 500 Cycles | Continuity After 904 Cycles |
|---|---|---|---|---|---|---|
| Control | 7.40 | 7.39 | Failed | | | |
| Control | 7.71 | 7.72 | 15.23 | 3.54 | 3.43 | Failed |
| Control | 7.38 | 7.36 | Failed | | | |
| Control | 7.42 | 8.68 | Failed | | | |
| A | 7.42 | 7.42 | 7.41 | 7.4 | Failed | |
| A | 7.78 | 7.76 | 7.71 | 7.77 | 7.82 | Failed |

As shown in Table 3, all of the formulations containing core shell polymers produced good stability after at least 379 cycles, while the formulations without core shell polymers performed poorly and usually failed after only 230 cycles.

TABLE 4

Underfill Reliability on OSP Substrate

| Underfill | Initial Elec. Continuity (ohms) | Continuity After 404 cycles | Continuity After 536 Cycles | Continuity After 658 Cycles | Continuity After 1136 Cycles | Continuity After 1531 Cycles |
|---|---|---|---|---|---|---|
| Control | 8.70 | 10.4 | 9.58 | 8.82 | 10.4 | Failed |
| Control | 8.64 | 9.2 | Failed | | | |
| Control | 8.03 | 12 | 8.16 | 9.4 | Failed | |
| A | 8.35 | 9.8 | 8.7 | 7.94 | 8.6 | 8.5 |
| A | 8.44 | 11.3 | 9.8 | 7.89 | 7.9 | 9.3 |

As shown in Table 4, all of the formulations containing core shell polymers produced good stability after at least 1531 cycles, while the formulations without core shell polymers failed after only 1136 cycles. Likewise formulation B provided good stability through at least 1108 cycles, as shown in Table 5.

TABLE 5

Underfill Reliability on OSP Substrate

| Underfill | Initial Elec. Continuity (ohms) | Continuity After 235 Cycles | Continuity After 496 Cycles | Continuity After 903 Cycles | Continuity After 980 Cycles | Continuity After 1108 Cycles |
| --- | --- | --- | --- | --- | --- | --- |
| B | 1.66 | 1.68 | 1.71 | 1.69 | 1.68 | 2.16 |

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

I claim:

1. A no-flow underfill encapsulant material comprising:
   a) one or more epoxy resins;
   b) one or more linear polyanhydride comprising particles that are equal to or smaller than 50 microns;
   c) one or more catalysts, and
   d) one or more core shell polymers, and
   e) a cyclic anhydride,
wherein the epoxy resin is selected from the group consisting of 3,4-epoxycyclohexylmethyl-3,4-epoxycyclohexane carboxylate, vinylcyclohexene dioxide, 3,4-epoxy-6-methyl cyclohexyl methyl-3,4-epoxycyclohexane carboxylate, dicyclopentadiene dioxide, bisphenol A resin, 2,2-bis(4-hydroxyphenyl) propane-epichlorohydrin copolymer, bisphenol F resin, epoxy novolac resin, poly(phenyl glycidyl ether)-co-formaldehyde, type epoxy resin, dicyclopentadiene-phenol epoxy resins, naphthalene epoxy resins, epoxy functional butadiene acrylonitrile copolymers, epoxy functional polydimethyl siloxane, and mixtures thereof and wherein the cyclic anhydride is a cycloaliphatic anhydride selected from the group consisting of methylhexa-hydro phthalic anhydride methyltetra-hydrophthalic anhydride, nadic methyl anhydride, hexa-hydro phthalic anhydride, tetra-hydro phthalic anhydride, dodecenylsuccinic anhydride, phthalic anhydride and mixtures thereof and comprises up to about 30 wt % of the encapsulant.

2. The no-flow underfill encapsulant of claim 1, wherein the epoxy resin comprises bisphenol-F epoxy resin containing more than one 1.2 epoxy group or molecule.

3. The no-flow underfill encapsulant of claim 2, wherein the epoxy resin comprises in the range of about 25 wt % to about 75 wt % of the encapsulant.

4. The no-flow underfill encapsulant of claim 3, wherein the epoxy resin comprises in the range of about 35 wt % to about 65 wt % of the encapsulant.

5. The no-flow underfill encapsulant of claim 4, wherein the epoxy resin is a mixture of bisphenol A and bisphenol F type epoxy resins.

6. The no-flow underfill encapsulant of claim 1, wherein the linear polyanhydride comprises polysebacic polyanhydride, polyazelaic polyanhydride, polyadipic polyanhydride or mixtures thereof.

7. The underfill encapsulant of claim 6, wherein the linear polyanhydride comprises polysebacic polyanhydride.

8. The underfill encapsulant of claim 6, wherein the linear polyanhydride comprises in the range of about 2 wt % to about 50 wt % of the encapsulant.

9. The underfill encapsulant of claim 8, wherein the linear polyanhydride comprises in the range of about 5 wt % to about 35 wt % of the encapsulant.

10. The underfill encapsulant of claim 1, wherein the catalyst is an imidazole.

11. The underfill encapsulant of claim 10, wherein the imidazole is blocked or protected for delayed reactivity.

12. The underfill encapsulant of claim 1, wherein the catalyst is selected from the group consisting of 1-cyanoethyl-2-ethyl-4-methyl-imidazole, alkyl-substituted imidazole, triphenylphosphine, imidazolium salts, imidazole phosphates, onium borate, metal chelates, and mixtures thereof.

13. The underfill encapsulant of claim 11, wherein the catalyst comprises in the range of about 0.05 wt % to about 1 wt % of the encapsulant.

14. The underfill encapsulant of claim 13, wherein the catalyst comprises in the range of about 0.1 wt % to about 0.25 wt % of the encapsulant.

15. The underfill encapsulant of claim 1, wherein the core shell polymer is selected from the group consisting of acrylonitrile-butadiene-styrene core shell polymer, methacrylate butadiene styrene core shell polymer, or mixtures thereof.

16. The underfill encapsulant of claim 15, wherein the core shell polymer is acrylonitrile-butadiene-styrene core shell polymer.

17. The underfill encapsulant of claim 15, wherein the core shell polymer comprises in the range of about 1 wt % to about 15 wt % of the encapsulant.

18. The underfill encapsulant of claim 17, wherein the core shell polymer comprises in the range of about 2 wt % to about 8 wt % of the encapsulant.

19. The underfill encapsulant of claim 1, wherein the encapsulant further comprises one or more of the group consisting of surfactants, coupling agents, reactive diluents, polymeric modifiers or mixtures thereof.

20. The underfill encapsulant of claim 19, wherein the surfactant is selected from the group consisting of organic acrylic polymers, silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers and mixtures thereof.

21. The underfill encapsulant of claim 19, wherein the reactive diluent is selected from the group consisting of p-tert-butyl-phenyl-glycidyl ether, allyl glycidyl ether, glycerol diglycidyl ether, glycidyl ether or alkyl, butanediodiglydidylether and mixtures thereof.

22. The underfill encapsulant of claim 1, wherein the epoxy resin comprises in the range of about 25 wt % to about 75 wt % of the encapsulant.

23. The underfill encapsulant of claim 22, wherein the epoxy resin comprises in the range of about 35 wt % to about 65 wt % of the encapsulant.

24. The no-flow underfill encapsulant of claim 1, wherein the epoxy resin is a mixture of bisphenol A and bisphenol F type epoxy resins.

* * * * *